United States Patent [19]

Graham, Jr. et al.

[11] 4,053,331
[45] Oct. 11, 1977

[54] METHOD OF MAKING AMORPHOUS METALLIC ALLOYS HAVING ENHANCED MAGNETIC PROPERTIES BY USING TENSILE STRESS

[75] Inventors: Charles D. Graham, Jr., Ardmore, Pa.; Philip J. Flanders, Moorestown, N.J.; Takeshi Egami, Narberth, Pa.

[73] Assignee: University of Pennsylvania, Philadelphia, Pa.

[21] Appl. No.: 709,875

[22] Filed: July 29, 1976

Related U.S. Application Data

[63] Continuation of Ser. No. 507,859, Sept. 20, 1974, abandoned, which is a continuation-in-part of Ser. No. 495,850, Aug. 8, 1974, abandoned.

[51] Int. Cl.² ............................................. H01F 1/00
[52] U.S. Cl. ............................... 148/120; 148/31.55; 148/131; 75/170; 75/134 F; 75/123 D
[58] Field of Search .................... 148/120, 131, 31.55, 148/108; 75/170, 134 F, 123 D

[56] References Cited

U.S. PATENT DOCUMENTS

| 3,582,408 | 6/1971 | Onyshkeyych | 148/108 |
| 3,607,460 | 9/1971 | Lommel | 148/31.55 |
| 3,820,040 | 6/1974 | Berry et al. | 148/120 |
| 3,856,513 | 12/1974 | Chen et al. | 75/123 D |

Primary Examiner—Walter R. Satterfield
Attorney, Agent, or Firm—Paul & Paul

[57] ABSTRACT

The magnetic properties of amorphous metallic alloys are improved significantly by application of stress to the alloy material. Selected alloys in ribbon form are subjected to controlled tensile stress, whereupon resulting magnetic properties are superior to corresponding conventional crystalline materials. So stressed, the amorphous alloy material may be applied to advantage as transformer cores, magnetic delay lines, magnetic computer cores, and the like.

8 Claims, 6 Drawing Figures

METHOD OF MAKING AMORPHOUS METALLIC ALLOYS HAVING ENHANCED MAGNETIC PROPERTIES BY USING TENSILE STRESS

CROSS REFERENCE TO PARENT

This is a continuation of application Ser. No. 507,859, filed 9-20-74, now abandoned and in turn a continuation in part of Ser. No. 495,850 filed 8/8/74 and now abandoned.

BACKGROUND OF THE INVENTION

This invention relates to amorphous metallic alloys. More particularly, it relates to the enhancement of the magnetic properties of amorphous metallic alloys.

Amorphous metallic alloys, also sometimes referred to as "glassy metals", result when certain component materials are quenched from the molten state to the solid state at extremely high rates. For example, quenching at the rate of $10^{5°}$ per second has been found to result in an alloy which is substantially homogeneous and amorphous in form. That is, the rapid cooling process prevents formation of a crystalline structure in the alloy material.

Until rather recently, the only known technology for the production of amorphous alloys utilized techniques such as vacuum evaporation, sputtering, electrodeposition, and the like. Also, the materials produced by those processes were not of convenient size or shape for extensive development for many purposes, and any attempts to alter the shape destroyed their amorphous, homogeneous character.

More recently, however, production techniques have been developed whereby amorphous alloys may be synthesized in a convenient ribbon shape, and at a cost which appears to be quite economical. Consequently, considerable academic and industrial efforts are being undertaken to develop useful applications for the amorphous alloy materials.

It is a primary object of the present invention to provide useful applications for the class of magnetic amorphous metallic alloys.

Relevant properties of amorphous metallic alloys may be summarized briefly. Although homogeneous in composition, the amorphous alloys typically possess considerable strength, in contrast to conventional high strength alloys which consist of two or more phases. Rather than having standard stress-strain curve having a limited linear elastic range, followed by an elongated plastic strain region terminating at the ultimate strength, or breaking point, the amorphous alloys characteristically show a linear elastic region followed by a slightly nonlinear region ending at the breaking point. Amorphous alloys do not show the yield point behavior typical of crystalline alloys. The alloys do show some creep, the slow deformation which may occur over long periods of sustained loading. Magnetically, the alloys are "soft" materials, in that they possess relatively high permeability (i.e., the ratio of magnetic flux density produced in a medium to the magnetizing force producing it).

It is a more particular object of the present invention, in conformity with the foregoing properties of amorphous metallic alloys, to provide methods for enhancing the fundamental magnetic properties thereof, and further for utilizing the enhanced material in apparatus applications.

SUMMARY OF THE INVENTION

Notwithstanding the traditional design rule which dictates that soft magnetic materials be used in an unstressed condition to the extent practicable, the present invention involves application of a controlled amount of elastic stress to the amorphous magnetic metallic alloys. In particular, as moderate, controlled stresses are applied to the amorphous alloys, their magnetic properties are substantially enhanced, with the result that the alloys may be utilized for magnetic applications with substantially better results than those obtainable utilizing unstressed amorphous alloys, or corresponding crystalline alloys.

Among the applications of the methods embodying the principles of the present invention are transformer cores, motor laminations, magnetic delay lines, stress and strain gauges, and computer memory cores.

In an illustrative embodiment, a ribbon of nickel-iron based alloy is subjected to a stress in the 10 to 20 kilogram per square millimeter range. There results an increase of 55% in the ratio of remanence to saturation, and a decrease in coercivity by a factor of two. In an illustrative application, the stress is in the range of 5 kilograms per square millimeter and the ribbon is utilized as a magnetic delay line, with an input winding at one end, and a sensing winding at the other. When a pulse of current is coupled to the input winding, a mechanical pulse is established in the ribbon, which traverses to the other end at a controlled, predetermined rate, where it is sensed at the other winding.

DETAILED DESCRIPTION

As set forth hereinbefore, practicable production methods for amorphous alloys of useful form only have been developed recently. Thus, only a limited variety of different compositions have been available for development and application of the principles of the present invention. However, in view of the properties and behavior stimulated and observed, the principles of the present invention are seen to be generally applicable to magnetic amorphous metallic alloys.

Basically, the magnetic characteristics which are manipulated in accordance with the principles of the present invention are the low field magnetic properties. Unloaded, the amorphous magnetic alloys possess a relatively low remanence and relatively high coercivity. As stress is linearly increased in the elastic range, the remanence at first increases linearly, but then falls off to a nearly exponential approach to the magnetic saturation level of the material. At a certain loading point, however, and thereybeyond up to the ultimate strength of the material, a fixed percentage near but below the saturation limit is achieved, and is maintained up to the breaking point. The coercivity correspondingly decreases with stress, but levels at a loading somewhat less than the limiting point for remanence. Thus, for a given amorphous magnetic metallic alloy, there exists only a certain range, or "window" in which loading has the desired effect. Unless that window is utilized, variation of magnetic properties with load will not be achieved. However, for maximum remanence and minimum coercive force, any stress at or above the limiting point, but short of a stress which will provide deformation or fracture, may be utilized.

It must be pointed out that the aforementioned range of stress is well above the yield point of conventional polycrystalline soft magnetic materials. Therefore, the application of the stress has beneficial effects exclusively upon amorphous materials. That is, if a stress of the aforementioned magnitude is applied to conventional soft magnetic materials, the materials will be severely plastically deformed causing serious adverse effects upon the low field magnetic properties, or they may even be fractured.

All of the compositions thusfar utilized have been possessed of positive magnetostriction. That is, when a magnetic field is imposed on the unstressed material, a slight physical expansion occurs. Generally, the stress applied in accordance with the principles of the present invention to enhance magnetic capabilities is a tensile stress for a material with positive magnetostriction and a compressive stress for a material with negative magnetostriction.

The first use of amorphous alloys under controlled stress is to replace conventional soft magnetic materials, such as permalloys and silicon-iron, both of which are primarily used as materials for transformer cores of various sizes and capacities, and for motor and generator laminations. The principal merits of the use of amorphous materials under controlled stress are: (1) their low field properties, i.e., the remanence, the coercive field, and permeability, may excell those of the permalloys, (2) they are far less sensitive to mechanical damage than the permalloys, particularly than the supermalloys which are so sensitive to mechanical force that extreme care must be exercised in handling, (3) their electrical resistivity is significantly higher than the permalloys (e.g., (three times), so that the high frequency performance is superior, (4) their production cost could be significantly lower than the conventional materials, inasmuch as the number of rolling operations is greatly reduced, and heat treatment in a hydrogen environment is unnecessary. In a suggested embodiment as a transformer core, opposite ends of the core material are subjected to pulling force in directions opposite one another. Wrapped around the core material are a plurality of separate windings, each having a predetermined number of turns and each having separate leads such that they may be coupled to desired input circuitry, or to the requisite output circuitry.

Another application is to known magnetic delay lines. It is known that the propagation of a mechanical wave across a given material may be predicted to a high degree of accuracy. Thus, when a delay of a specified time is desired, one method of achieving it is to couple a mechanical pulse to the material at one end, and to sense the arrival of the propagated mechanical pulse at the other end. The intervening time is the prescribed delay, and is a function of the dimensions and composition of the material. Stressed amorphous magnetic metallic alloys in accordance with the principles of the present invention may be utilized to considerable advantage as the propagation material for mechanical pulses in the above embodiments in that the mechanical pulse may be both induced and sensed electromagnetically. A ribbon of amorphous alloy is subjected to stress, the stress being in the nearly linear elastic range appropriately intermediate the unstressed and saturation conditions, and also to a biasing d.c. magnetic field. At one end, a current pulse is applied to a winding on the ribbon, thereby inducing a magnetostrictive contraction or expansion, depending upon polarity of the pulse and sign of the magnetostriction, which propagates along to the other end of the ribbon. On the other end is another winding coupled to appropriate sensing circuitry. Upon the arrival of the propagating mechanical pulse, a current pulse is induced in the second winding, which may be sensed by conventional means. Effectively, the coils have experienced an altered mutual inductance by means of the magneto-mechanical wave propagation in the magnetically enhanced stressed delay line.

Yet another application of stressed amorphous metallic materials in accordance with the principles of the present invention is in the field of computer memory cores. In one of the most common computer memory constructions, large matrices of energizing and sensing wires pass through small annular ferromagnetic core elements. Depending upon the direction in which a current pulse is passed through an energizing wire, the circumferential magnetic orientation in the annular core is established in one direction or the other, thereby representing binary one and zero states. Other wires passing through sense the present orientation of the magnetic field, and thereby the current binary state represented by the core. Since the primary storage mode in the cores is magnetic, it is apparent that the cores should be fabricated of materials which have superior magnetic properties. Accordingly, amorphous alloy ribbon may be wound about an appropriate support in a tensioned state, thereby providing an enhanced magnetic core element.

Still another application of stressed amorphous metallic alloys in accordance with the principles of the present invention is in the area of stress and strain gauges. If a ribbon of alloy is applied in a suitably stressed fashion to the tested apparatus, the variation of magnetic properties in the alloy will be further varied by the strain response of the monitored apparatus. Any change of stress in the alloy may be monitored manetically. That is, the degree of elongation (or compression) of the apparatus being monitored will translate into increased (or decreased) stress in the amorphous alloy, and consequent variation of the magnetic properties thereof. Thereupon, such alteration of magnetic properties may be sensed and developed in accordance with standard techniques, such as those set forth in the examples set forth hereinafter. Preferably, an alloy ribbon is provided with three windings, a first one having an oscillating signal thereon, a second one having an opposing signal effectively to decouple the first and third coils, and the third one being a sensing coil and having means for sensing induced current changes therein caused by stress changes in the material.

The foregoing embodiments are illustrative of some of the applications of stressed amorphous magnetic metallic alloy materials having enhanced magnetic properties, but the catalog of applications is by no means limited thereto. Following are examples of specific tests and the results thereof for specific amorphous alloy materials, which illustrate the principles of the present invention. Wherever appropriate, actual XY plots developed during the test are submitted.

EXAMPLE

Example No. 1

Figure 1A:
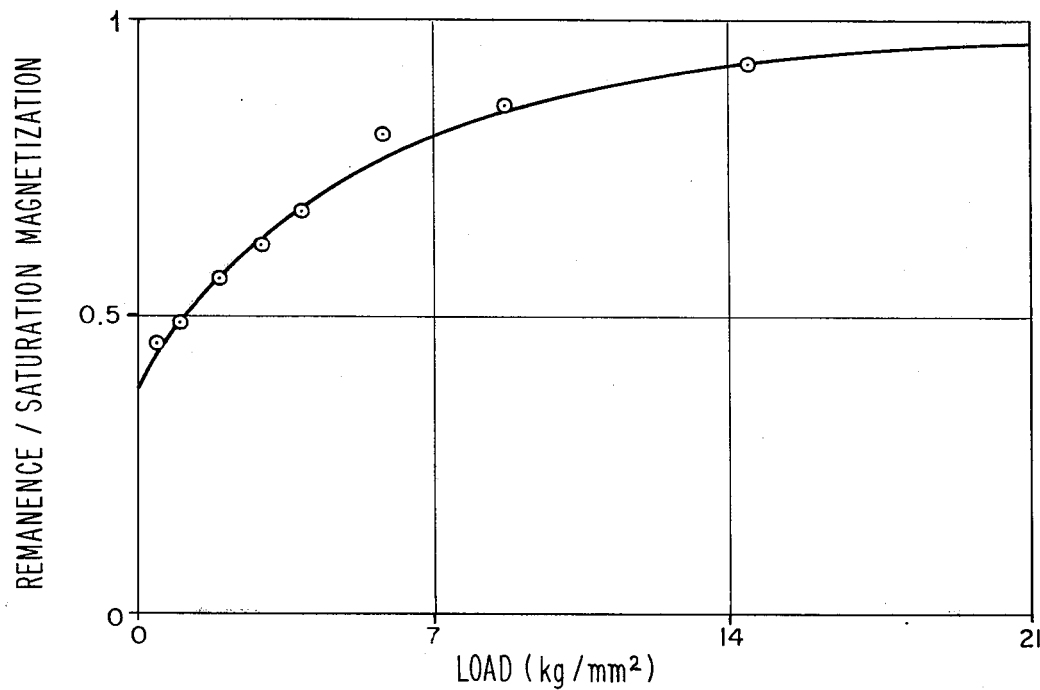
FIGS. 1-A through 1-C show illustrative graphs for Example 1 set forth hereinafter.
Figure 1B:
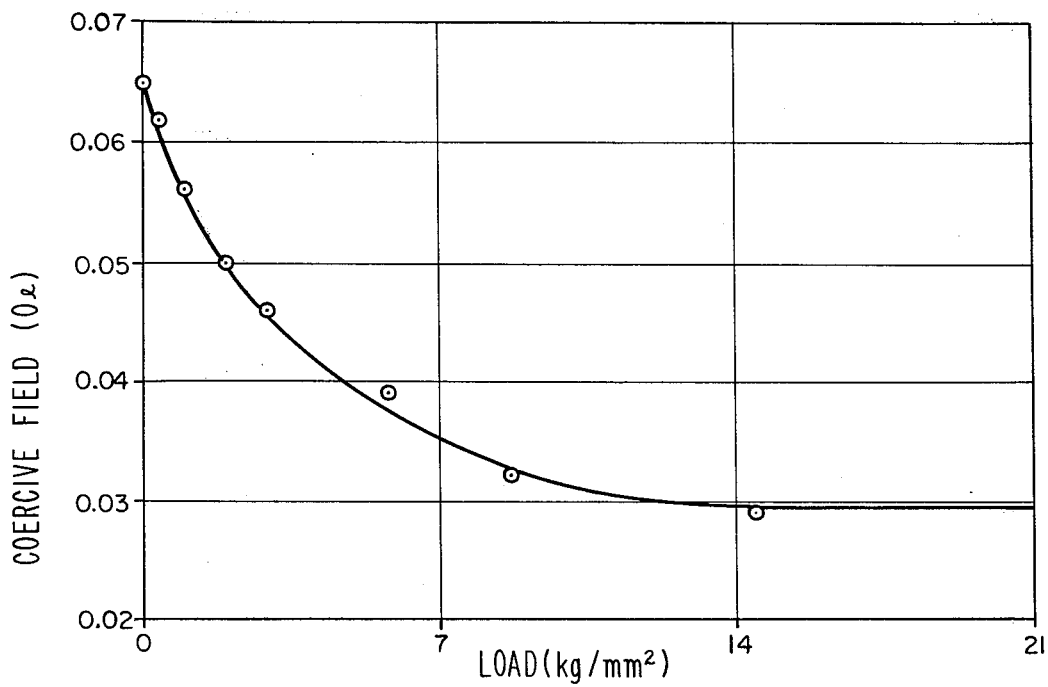

A straight single length of amorphous alloy ribbon 10 centimeters long, 1.5 millimeters wide, and 35 micrometers thick composed of nickel, 40 atomic percent; iron, 40 atomic percent; phosphorous, 14 atomic percent; and boron, 6 atomic percent was selected. The sample was placed in a long solenoid oriented perpendicular to the earth's magnetic field. The sample was then subjected to tensile stress in increments up to, but short of, the ultimate strength of the ribbon. The remanence of the material, as a percent of saturation magnetization and as a function of load, was determined, as was the coercive field, measured in Oersteds. The variation of remanence and coercivity are plotted in FIGS. 1A through 1C.

Without loading, the remanence was measured to be 35% of saturation magnetization, and the coercivity to be 0.065 Oersteds. As the load was increased to 15 kilograms per square millimeter, the remanence increased to 92% of saturation, while the coercivity decreased to 0.03 Oersteds. Therebeyond, no further change in coercivity occurred with increasing load. However, the remanence continued to increase from 92% to 96% of saturation as the load was increased to 20 kilograms per square millimeter. Therebeyond, no further change in remanence was noted. Under a stress of 15 kilograms per square millimeter, the value of remanence (7.9 kilogauss) and the coercivity (0.03 Oersteds) compare favorably to those of 4–79 Mo-Permalloy, which is representative of permalloys, i.e., 5 kilogauss and 0.05 Oersteds respectively.

Figure 1C:
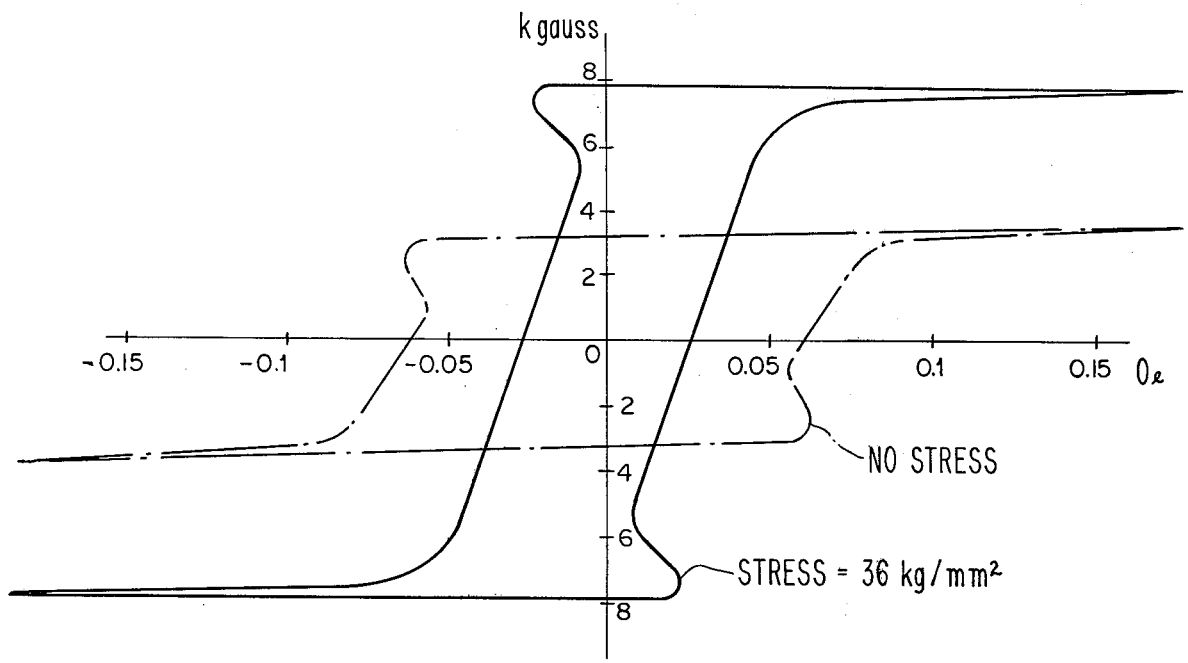

FIG. 1C shows an X—Y plot of hysteresis loops of the material in an unstressed state and in a stressed state having maximum obtainable remanence and minimum obtainable coercivity by stressing the material. In the conventional fashion, the graph of FIG. 1C represents magnetic flux density plotted against magnetizing force. Accordingly, the variation of flux density on the ordinate in response to a given field on the abscissa provides an excellent measure of magnetic properties. Also, the relative squareness of the loop represents a measure of magnetic performance, in that it represents the rapidity with which the field may be shifted from one direction to the other. It may be seen from the graph that the loaded sample represents a considerable improvement over the unloaded sample in both respects.

EXAMPLE NO. 2

Figure 2C:
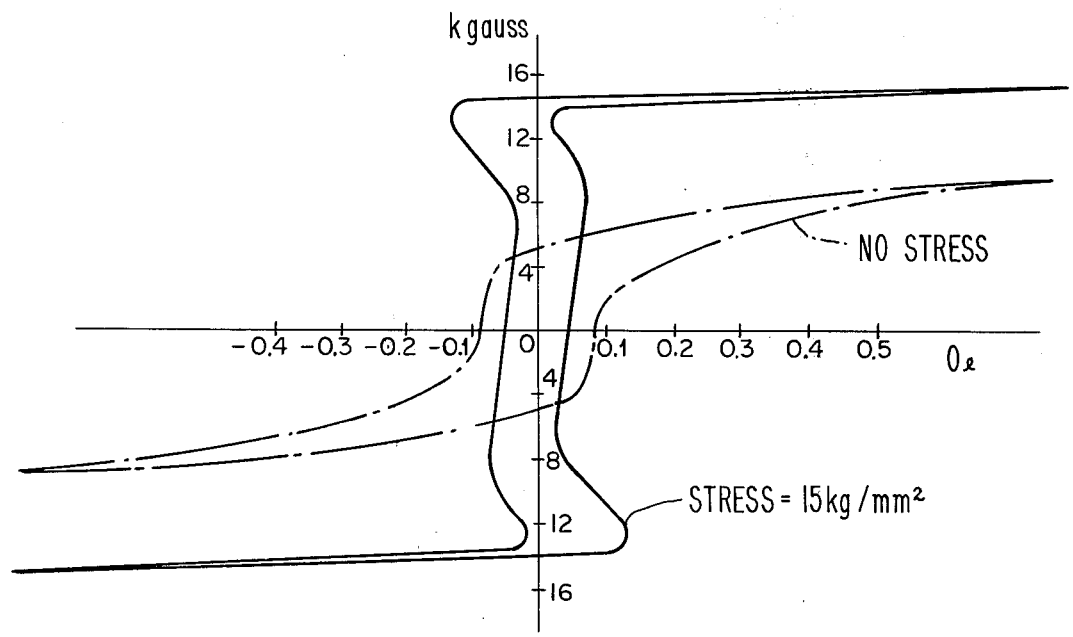
FIGS. 2-A through 2-C show illustrative graphs for Example 2 set forth hereinafter.
Figure 2A:
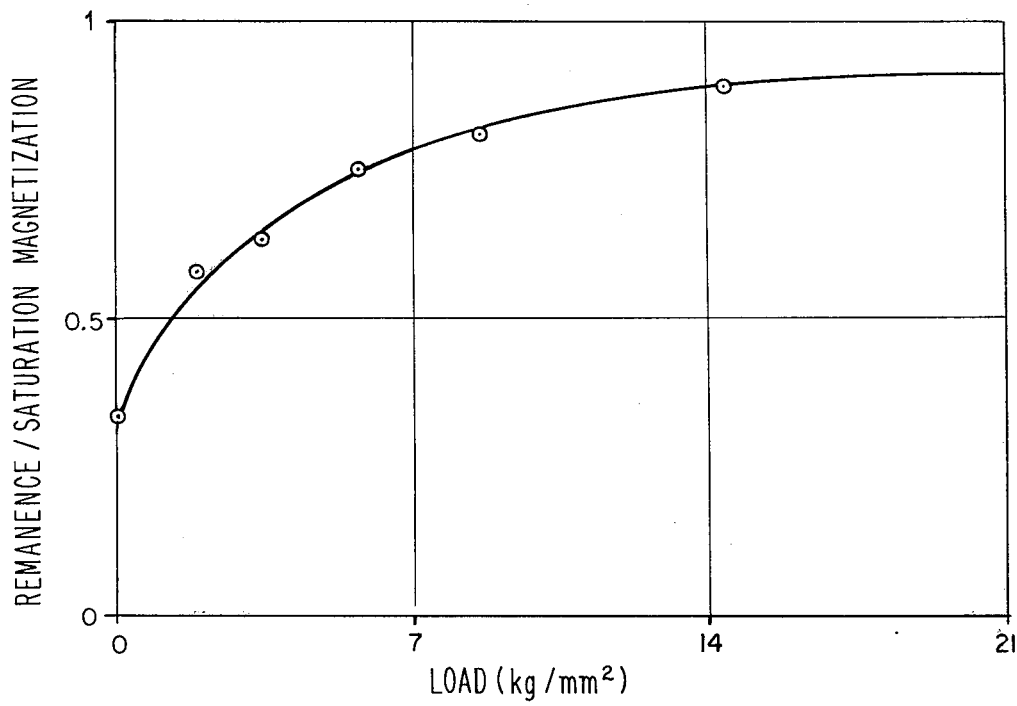
Figure 2B:
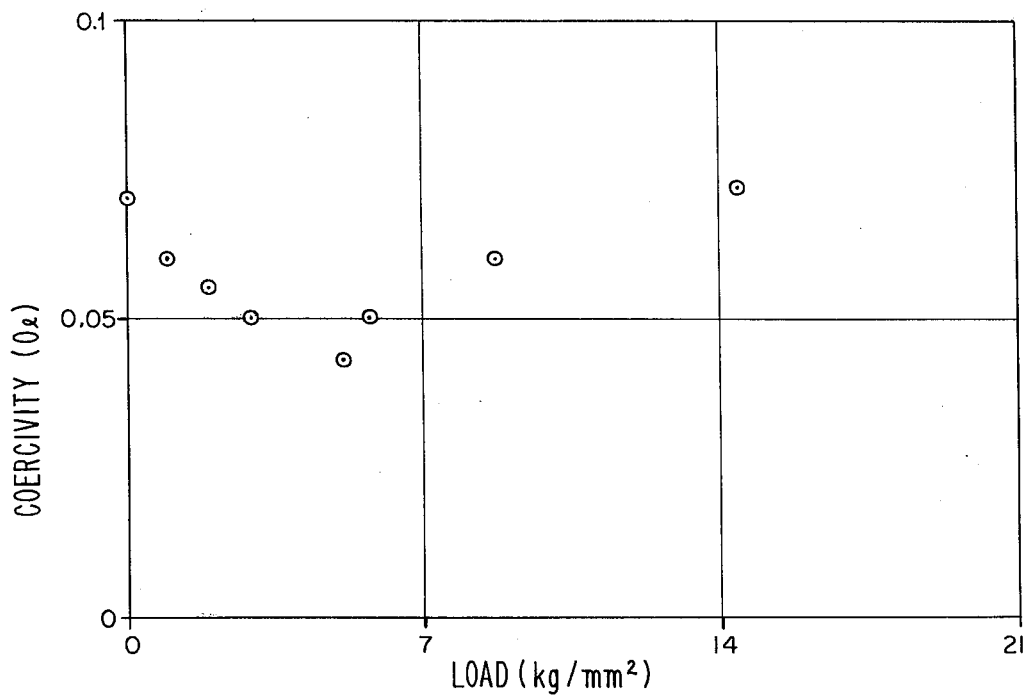

A 10 centimeter by 1.5 millimeter by 35 micrometer amorphous magnetic alloy ribbon composed of iron, 80 atomic percent; phosphorous, 16 atomic percent; carbon, 3 atomic percent; and boron, 1 atomic percent was set up identically to the sample of experiment 1, and stressed similarly. The variation of remanence and coercivity as a function of load are plotted in FIG. 2-A and 2-B, respectively, and the variation in hysteresis loops between extremes of stress loading are shown in FIG. 2-C. Under a stress of 15 kilograms per square millimeter, the remanence was 14.8 kiogauss and the coercivity 0.055 Oersted. These values compare favorably to those of Deltamax, a high flux oriented grain Hi—Fe alloy, i.e. 14.4 kilogauss and 0.09 Oersted respectively. As set forth in FIGS. 2-A and 2-B, the effect of loading upon remanence and coercivity is as follows.

The remanence variation with stress, which is shown in FIG. 2-A, is similar in form to that of FIG. 1-A, and demonstrates changes of similar order of magnitude. the variation of coercivity, as shown in FIG. 2-B, is slight and irregular. This irregularity is attributable to the general difficulty of accurately measuring coercivity for some samples, and detected structural irregularities in the samples tested.

The hysteresis loops of FIG. 2-C show enhancement of magnetic properties similar to those of FIG. 1-C for the other samples.

We claim:

1. A method of providing a metal having superior magnetic properties, including low coercivity and high permeability, comprising the steps of:
    a. selecting a metal from the group consisting of the substantially amorphous, noncrystalline metallic magnetic alloys having positive magnetostriction;
    b. subjecting said alloy to a tensile stress less than the elastic limit of the alloy; and
    c. sustaining said tensile stress, thereby producing, during said sustaining step, an amorphous alloy having superior soft magnetic properties including low coercivity and high permeability.

2. A method as described in claim 1 wherein said selecting step includes selecting an amorphous metal from the group having a majority proportion of nickel and iron.

3. A method as described in claim 1 wherein said alloy material consists essentially of, by atomic percent: nickel 40%; iron 40%; phosphorous 14%; and boron 6%.

4. A method as described in claim 1 wherein said alloy material is selected from the group having at least a majority proportion of iron.

5. A method as described in claim 4 wherein said alloy material consists essentially of, by atomic percent: iron 80%; phosphorous 16%; carbon 3%; and boron, 1%.

6. A method as described in claim 1 wherein said subjecting step comprises placing elastic tensile stress on said material.

7. A method as described in claim 1 wherein said subjecting step includes the steps of gradually increasing the stress on said material to a point above which no further change is experienced in coercivity, and then ceasing said stress increase.

8. A method as described in claim 7 wherein said subjecting step includes the steps of gradually increasing the stress on said material beyond said point and still further until no further increase is experienced in remanence, and then ceasing said stress increase.

* * * * *